United States Patent
Kurz et al.

(10) Patent No.: US 9,287,211 B2
(45) Date of Patent: Mar. 15, 2016

(54) SEMICONDUCTOR DEVICE COMPRISING METAL-BASED EFUSES OF ENHANCED PROGRAMMING EFFICIENCY BY ENHANCING HEAT GENERATION

(75) Inventors: Andreas Kurz, Dresden (DE); Jens Poppe, Radebeul (DE); Matthias Kessler, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 1037 days.

(21) Appl. No.: 13/032,710

(22) Filed: Feb. 23, 2011

(65) Prior Publication Data
US 2011/0241162 A1    Oct. 6, 2011

(30) Foreign Application Priority Data
Mar. 30, 2010 (DE) .......... 10 2010 003 450

(51) Int. Cl.
H01L 23/535 (2006.01)
H01L 29/00 (2006.01)
H01L 23/525 (2006.01)

(52) U.S. Cl.
CPC ..... H01L 23/5256 (2013.01); *H01L 2924/0002* (2013.01); *H01L 2924/3011* (2013.01)

(58) Field of Classification Search
USPC .......... 257/529, E23.168; 977/762
See application file for complete search history.

(56) References Cited

U.S. PATENT DOCUMENTS

| | | | |
|---|---|---|---|
| 6,500,722 B2 * | 12/2002 | Wada et al. | 438/381 |
| 7,348,654 B2 * | 3/2008 | Hsieh et al. | 257/528 |
| 2008/0206978 A1 * | 8/2008 | Hsu et al. | 438/601 |
| 2009/0146251 A1 * | 6/2009 | Ueda | 257/529 |

FOREIGN PATENT DOCUMENTS

DE    60 2004 008 339 T2    5/2008

OTHER PUBLICATIONS

Translation of Official Communication from German Patent Application No. 10 2010 003 450.9-33 dated Dec. 10, 2010.

* cited by examiner

*Primary Examiner* — Marvin Payen
*Assistant Examiner* — Vernon P Webb
(74) *Attorney, Agent, or Firm* — Amerson Law Firm, PLLC

(57) ABSTRACT

In sophisticated semiconductor devices, electronic fuses may be provided in the metallization system, wherein a superior two-dimensional configuration of the metal line, for instance as a helix-like configuration, may provide superior thermal conditions in a central line portion, which in turn may result in a more pronounced electromigration effect for a given programming current. Consequently, the size of the electronic fuse, at least in one lateral direction, and also the width of corresponding transistors connected to the electronic fuse, may be reduced.

16 Claims, 3 Drawing Sheets

SEMICONDUCTOR DEVICE COMPRISING METAL-BASED EFUSES OF ENHANCED PROGRAMMING EFFICIENCY BY ENHANCING HEAT GENERATION

BACKGROUND OF THE INVENTION

1. Field of the Invention

The present disclosure generally relates to the field of fabricating integrated circuits, and, more particularly, to forming electronic fuses in the metallization system of the semiconductor device for providing device-internal programming capabilities in complex integrated circuits.

2. Description of the Related Art

In modern integrated circuits, a very high number of individual circuit elements, such as field effect transistors in the form of CMOS, NMOS, PMOS elements, resistors, capacitors and the like are formed on a single chip area. Typically, feature sizes of these circuit elements are decreased with the introduction of every new circuit generation, to provide currently available integrated circuits with high performance in terms of speed and/or power consumption. A reduction in size of transistors is an important aspect in steadily improving device performance of complex integrated circuits, such as CPUs. The reduction in size of the transistors is commonly associated with an increased switching speed, thereby enhancing signal-processing performance. In addition to the large number of transistor elements, a plurality of passive circuit elements, such as capacitors, resistors and the like, are typically formed in integrated circuits that are used for a plurality of purposes.

Due to the reduced dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

In modern integrated circuits, minimal features sizes have now reached approximately 50 nm and less, thereby providing the possibility of incorporating various functional circuit portions in a given chip area, wherein, however, the various circuit portions may have a significantly different performance, for instance with respect to lifetime, reliability and the like. For example, the operating speed of a digital circuit portion, such as a CPU core and the like, may depend on the configuration of the individual transistor elements and also on the characteristics of the metallization system, which may include a plurality of stacked metallization layers so as to comply with the required complex circuit layout. Thus, highly sophisticated manufacturing techniques may be required in order to provide the minimum critical feature sizes of the speed-critical circuit components. For example, sophisticated digital circuitry may be used on the basis of field effect transistors, which represent circuit components in which the conductivity of a channel region is controlled on the basis of a gate electrode that is separated from the channel region by a thin dielectric material. Performance of the individual field effect transistors is determined by, among other things, the capability of the transistors to switch from a high impedance state into a low impedance state at high speeds, wherein also a sufficiently high current may be driven in the low impedance state. This drive current capability is determined by, among other things, the length of the conductive channel that forms in the channel region upon application of an appropriate control voltage to the gate electrode. For this reason, and in view of the increasing overall packing density of sophisticated semiconductor devices, the channel length, and thus the length of the gate electrode, is being continuously reduced, which, in turn, may require an appropriate adaptation of the capacitive coupling of the gate electrode to the channel region. Consequently, the thickness of the gate dielectric material may also have to be reduced in order to maintain controllability of the conductive channel at a desired high level. However, the shrinkage of the gate dielectric thickness may be associated with an exponential increase of the leakage currents, which may directly tunnel through the thin gate dielectric material, thereby contributing to enhanced power consumption, and thus waste heat, which may contribute to sophisticated conditions during operation of the semiconductor device. Moreover, charge carriers may be injected into the gate dielectric material and may also contribute to a significant degradation of transistor characteristics, such as threshold voltage of the transistors, thereby also contributing to variability of the transistor characteristics over the lifetime of the product. Consequently, reliability and performance of certain sophisticated circuit portions may be determined by material characteristics and process techniques for forming highly sophisticated circuit elements, while other circuit portions may include less critical devices, which may thus provide a different behavior over the lifetime compared to critical circuit portions. Therefore, the combination of the various circuit portions in a single semiconductor device may result in a significant different behavior with respect to performance and reliability, wherein also the variations of the overall manufacturing process flow may contribute to a further discrepancy between the various circuit portions. For these reasons, in complex integrated circuits, frequently, additional mechanisms may be implemented so as to allow the circuit to be adapted in view of performance of certain circuit portions to comply with the performance of other circuit portions, for instance after completing the manufacturing process and/or during use of the semiconductor device, for instance when certain critical circuit portions may no longer comply with corresponding performance criteria, thereby requiring an adaptation of certain circuit portions, such as readjusting an internal voltage supply, re-adjusting the overall circuit speed and the like.

For this purpose, so-called electronic fuses or e-fuses may be provided in the semiconductor devices, which may represent electronic switches that may be activated once in order to provide a desired circuit adaptation. Hence, the electronic fuses may be considered as having a high impedance state, which may typically also represent a "programmed" state, and having a low impedance state, typically representing a non-programmed state of the electronic fuse. Since these electronic fuses have a significant influence on the overall behavior of the entire integrated circuit, a reliable detection of the non-programmed and the programmed state has to be guaranteed. Furthermore, since typically these electronic fuses may be actuated only once over the lifetime of the semiconductor device under consideration, a corresponding programming activity has to ensure that a desired programmed state of the electronic fuse is reliably generated in order to provide well-defined conditions for the further operational lifetime of the device. With the continuous shrinkage of critical device dimensions in sophisticated semiconductor devices, however, the reliability of the programming of corresponding electronic fuses may require tightly set margins for the corresponding voltages and currents used to program the electronic fuses, which may not be compatible with the overall specifications of the semiconductor devices, or may at least have a severe influence on the flexibility of operating the device.

In conventional strategies, the fuses are formed on the basis of a semiconductor material, such as polysilicon and the like, as may typically also be used for forming conductive lines in the device level of the semiconductor device, for instance for gate electrode structures of field effect transistors, wherein the per se negative effect of electromigration in combination with a charge carrier depletion in the semiconductor material may be taken advantage of in order to initiate a significant deterioration of the electronic fuse by applying a current for programming the fuse into a high impedance state. As is well known, electromigration is a phenomenon in which a high current density in DC operated conductive lines may result in a "diffusion" of metal atoms caused by the momentum transfer of the high-density electron flow. In polysilicon lines, typically, a metal silicide material is provided to enhance the conductivity of the semiconductor-based material, and a pronounced electromigration effect may, thus, be intentionally initiated in the metal silicide material, thereby increasingly contributing to a metal depletion at the cathode, while a material agglomeration is observed towards the anode. Furthermore, the electromigration effect may be further increased by locally creating elevated temperatures, which may be accomplished by locally providing a desired high resistance for a given total current that is to be driven through the electronic fuse. Consequently, appropriate lateral dimensions for fuse bodies, i.e., the portions of the electronic fuses in which an electromigration effect and, thus, the line degradation is to be initiated, are provided for a given material composition and thickness of the electronic fuses, in accordance with the overall process strategy for forming the sophisticated gate electrode structures of the field effect transistors. For example, the cross-sectional area of the fuse bodies may be reduced by selecting a minimum width of the fuse bodies, while, at the same time, the length of the fuse bodies may be increased, thereby increasing the overall electromigration effect.

Due to the increasing overall complexity of semiconductor devices, however, an increased number of electronic fuses has to be provided, which, however, may result in a significant consumption of valuable chip area in the device level of the semiconductor devices. Furthermore, recently, very complex gate electrode structures are being implemented in sophisticated semiconductor devices in order to enhance transistor performance, wherein the conventional gate materials, such as silicon dioxide as a gate dielectric and polysilicon in combination with a metal silicide as an electrode material, are replaced by a high-k dielectric material in combination with an electrode metal, such as aluminum and the like. As a consequence, materials of improved conductivity may be implemented in the fuse bodies, unless additional significant efforts have to be made so as to locally provide the conventional polysilicon/metal silicide material system for the electronic fuses. Thus, the incorporation of highly conductive metals, such as aluminum and the like, in the device level and the demand for further increasing the overall packing density in semiconductor devices have recently resulted in the concept of providing electrically programmable fuses on the basis of metals, thereby also considering the possibility of implementing "three-dimensional" fuses, which may, thus, be provided in the metallization system of the semiconductor device.

In complex semiconductor devices, typically, metallization systems, i.e., a plurality of stacked metallization levels, are provided, in which metal lines provide the inner level electrical connection, while so-called vias, i.e., "vertical" interconnect structures, may provide the intra-level connection, thereby providing the complex interconnect network in order to electrically connect the individual circuit elements provided in the device level according to the required circuit layout. The metal lines and vias typically comprise a highly conductive metal, such as copper, which may exhibit a reduced electromigration effect and an overall higher conductivity compared to aluminum. Due to copper's characteristic to readily diffuse in a plurality of well-established dielectric materials, such as silicon dioxide and silicon dioxide-based low-k dielectric materials, which are typically used in combination with copper material in order to reduce signal propagation delay caused by the parasitic capacitance in the metallization system, a conductive barrier material, such as tantalum, tantalum nitride and the like, is to be formed in the metal lines and vias.

Since reliability and lifetime of complex semiconductor devices may essentially be determined by the duration of the metallization system, significant efforts are being made in investigating line degradation mechanisms in metallization systems caused by electromigration, since a complex interaction between dielectric materials, the conductive copper material and the geometry of conductive parts has to be taken into consideration in order to quantitatively estimate the overall performance and degradation of metal features over a lifetime. On the other hand, any technical knowledge about the electromigration mechanisms in copper-based metallization systems may be advantageously used in designing appropriate electronic fuses in which the electromigration effect is exploited for obtaining a permanent line degradation, which thus may reliably indicate a programmed state of the electronic fuse.

With reference to FIGS. 1a-1b, a metal fuse formed in a metallization system may be described in more detail in order to describe some of the disadvantages associated with conventional metal fuses.

FIG. 1a schematically illustrates a top view of a semiconductor device 100 comprising a metallization system 150, which is formed on the basis of copper material in combination with sophisticated dielectric materials, such as low-k dielectric materials and the like. The metallization system 150 may typically comprise a plurality of stacked metallization layers, wherein, for convenience, a first metallization layer 110 is schematically illustrated so as to include first and second metal lines 111, 112. The metal lines 111, 112 are typically embedded in a dielectric material that is not shown in FIG. 1a and which is described with reference to FIG. 1b. Moreover, a second metallization layer 120 is provided which comprises an electronic fuse 130, which may be represented by a metal line 131 in combination with a plurality of vias 133, 134A, 134B which connect the metal line 131 with the metal lines 112, 111, respectively. In the example shown in FIG. 1a, the electronic fuse 130 is designed so as to be operated on the basis of a DC current pulse in which an electron flow may be directed from the metal line 112 through the via 133 into the metal line 131 and further into the vias 134A, 134B into the metal line 111. According to this configuration, the electronic fuse 130 is designed such that, upon establishing an appropriate current density in the electronic fuse 130, line degradation may occur in a well-defined portion of the electronic fuse 130, which, in the example shown, is represented by the via 133 and a portion of the metal line 131 formed between the via 133 and the via 134A and having a length indicated by 130L. Similarly, a width 130W of the metal line 131 may be selected in accordance with the design rules for the metallization layer 120, that is, typically, the width 130W is selected so as to correspond to the minimum critical dimension in the metallization layer 120 in order to provide a reduced cross-sectional area in the metal line 131, thereby enhancing the generation of heat in the metal line 131 and thus also enhancing electromigration in the electronic fuse 130. Similarly, the length 130L may be appropriately adapted in view of the width 130W and a thickness of the metal line 131 in order to obtain the desired electronic characteristics of the electronic fuse 130.

FIG. 1b schematically illustrates a cross-sectional view of the semiconductor device 100 according to the line Ib. As illustrated, the device 100 comprises a substrate 101, which is to be understood as any appropriate carrier material and an appropriate semiconductor material, in and above which circuit elements, such as transistors and the like, are provided, which, for convenience, are not shown in FIGS. 1a-1b. It should be appreciated that respective circuit elements may include sophisticated transistors, such as field effect transistors having a gate length of 50 nm and less in sophisticated devices. Moreover, corresponding circuit elements may also include any support circuitry for the electronic fuse 130 in order to establish a desired current flow therein upon programming the fuse 130 and also to determine the status of the electronic fuse 130. For example, corresponding transistors for supplying the programming current may be provided with an appropriate transistor width in order to reliably switch on and off current required for programming the electronic fuse 130 so that the transistor size has to be adapted to the electronic characteristics of the fuse 130. Furthermore, the semiconductor device 100 comprises any appropriate contact structure (not shown) so as to provide an interface between semiconductor-based circuit elements and the metallization system 150. The metallization layer 110 comprises an appropriate dielectric material 115, which may, at least partially, be provided in the form of a low-k dielectric material, depending on the electronic performance required in the metallization layer 110. As illustrated, the metal lines 111, 112 are embedded in the dielectric material 115 and may typically comprise a conductive bulk or core metal 112A in the form of copper and a conductive barrier material or material system 112B, such as tantalum nitride, tantalum and the like. Furthermore, an etch stop material or a dielectric barrier layer 116, for instance in the form of silicon nitride, nitrogen-enriched silicon carbide and the like, is formed on the dielectric material 115 and on the metal lines 111, 112.

Similarly, the metallization layer 120 comprises a dielectric material 125, such as a low-k dielectric material and the like, in which the electronic fuse 130, i.e., the metal line 131 and the vias 133, 134A, 134B, are embedded. Also in this case, a highly conductive copper core metal 131A in combination with an appropriate barrier material 131B is provided. Additionally, a dielectric etch stop material or cap layer 126, which may have basically the same configuration as the layer 116, is formed on the dielectric material 125 and the metal line 131.

The semiconductor device 100 as illustrated in FIGS. 1a-1b may be formed on the basis of the following process strategies. After forming any semiconductor-based circuit elements in and above the substrate 101, a contact structure is provided, for instance on the basis of well-established manufacturing strategies. Thereafter, the metallization system 150 may be formed, for instance by depositing the dielectric material 115 for the metallization layer 110 on the basis of any appropriate deposition technique. It should be appreciated that one or more metallization layers may be formed below the metallization layer 110 if considered appropriate. Thereafter, the dielectric material 115 is patterned so as to form appropriate trenches for the metal lines 111, 112, which are subsequently filled with the barrier material 112B and the copper material 112A. After the removal of any excess material, the etch stop layer 116 is provided on the basis of any appropriate deposition technique, wherein, if required, a conductive cap material (not shown) may be formed on the copper material 112A. Similarly, the metallization layer 120 is formed by depositing the dielectric material 125 and patterning the same so as to provide openings for the vias 133, 134A, 134B and a trench for the metal line 131A. It should be appreciated that openings for other metal lines and vias are to be concurrently formed in the metallization layer 120, which may be accomplished on the basis of given design rules, which determine the minimum line width and spaces that may be reliably formed in the metallization layer 120 for given process-related variations. As discussed above, the geometry of the electronic fuse 130 has to be adapted in view of achieving the desired line degradation of the electronic fuse 130 for given design rules for the metallization layer 120. That is, a thickness 130T and the width 130W (FIG. 1a) may be substantially determined by the overall design rules since, for instance, the width 130W cannot be reduced beyond the minimum critical feature size in the metallization layer 120 without introducing significant non-uniformities. Consequently, the length 130L (FIG. 1a) is appropriately selected, typically as a compromise between space consumption and acceptable overall conductivity of the fuse 130, in order to provide the required electronic characteristics. That is, selecting an increased length may generally result in a higher resistivity of the electronic fuse 130 which, on the other hand, may consume more space in the metallization system 150. On the other hand, a reduced length may require significantly increased programming current pulses, which in turn may thus require correspondingly dimensioned transistors in the device level of the device 100, which may thus also contribute to an increased lateral size of the semiconductor device 100. Typically, electronic fuses formed in the metallization system 150 may nevertheless require a programming current of a magnitude that is up to three times and higher compared to conventional semiconductor-based electronic fuses provided in the device level, as discussed above.

Upon operating the device 100, a current flow 102 is established in a flow path when programming the electronic fuse 130, wherein a portion of the current flow path is represented by the metal line 112, the via 133, the metal line 131, the vias 134A, 134B and the metal line 111. As indicated, the electron flow is directed from the metal line 112 to the metal line 111 via the electronic fuse 130. As previously indicated, electromigration is a highly complex dynamic process in which the momentum exchange between charge carriers, that is electrons, and metal atoms, i.e., copper atoms, may result in a collective migration of the metal atoms when a sufficiently high current density is achieved. Since, generally, reduced cross-sectional areas are provided in the metal lines of sophisticated metallization systems, and due to the fact that, in principle, the metal lines are confined in a dielectric material allowing an efficient heat transfer into the surrounding chip area, extremely high current densities of approximately $10^6$ ampere per $m^2$ may be achieved, thereby resulting in significant electromigration effects. Thus, unless the metallization structure of a semiconductor device is designed and manufactured in such a way that such high current densities may be reliably avoided in any metal region of the semiconductor device, electromigration will occur during the operation of the device 100. Thus, great efforts are being made in appropriately estimating the electromigration effect in metallization systems and thus estimating the lifetime of the metallization system, since manufacturing substantially "immortal" metallization structures would require significantly increased overall dimensions, which is not compatible with economic constraints in view of producing sophisticated semiconductor devices. On the other hand, in the electronic fuse 130, the electromigration effect may be intentionally induced in order to obtain a high ohmic state as the programmed status of the electronic fuse 130. To this end, the via 133 and the metal line 131 may be provided with a configuration so as to intentionally create significant damage and thus line degradation upon establishing a current flow in the electronic fuse 130. Thus, electromigration may occur in the via 133 and the metal line 131 so that, increasingly, metal may be transported along the current flow direction, thereby densifying the material in the metal line towards the anode of the electronic fuse 130, i.e., towards the vias 134A, 134B. On the other hand, a material depletion may occur within the via 133 and the metal line 131 in an area in the vicinity of the via 133. It should be appreciated that significant electromigration effects in the metal line 112 may be avoided by selecting appropriate cross-sectional dimensions and thus providing a reduced current density, while additionally the barrier material 131B at the bottom of the via 133 may also suppress any copper diffusion from the metal line 112 into the via 133. Similarly, significant electromigration may be avoided within the vias 134A, 134B due to the overall increased cross-sectional area. Consequently, the material accumulation towards the vias 134A, 134B and the material depletion in the vicinity of the via 133 may thus result in a significant modification of the conductivity state of the electronic fuse 130, which may be detected by any appropriate peripheral circuitry.

As indicated above, despite an efficient electromigration effect, nevertheless, significantly higher currents may be required for reliably programming the metal fuse 130. Due to the overall increased conductivity of metal-based fuses compared to semiconductor-based fuses, the generation of any heat, which may also increase the overall electromigration effect upon programming the fuse 130, may be reduced, thereby also contributing to increased total current values upon "blowing" the electronic fuse 130. Furthermore, the desired electromigration and thus material migration along the metal line 131 towards the vias 134A, 134B may finally result in copper extrusion, i.e., in the migration of copper from the metal line 131 into the surrounding dielectric material 125, which may be less desirable, in particular when using sophisticated low-k dielectric materials, since then significant copper diffusion may occur in the material 125 in a highly non-predictable manner. In order to suppress non-predictable copper extrusion into the dielectric material 125, frequently, additional "extrusion" lines are provided, i.e., metal lines adjacent to the metal line 131, thereby appropriately "confining" the copper extrusion to a specific area within the dielectric material 125. In this case, however, the thermal conditions may be significantly affected by the presence of additional extrusion lines, since these metal lines may act as efficient heat sinks for dissipating any waste heat generated in the electronic fuse 130, thereby requiring even further increased current values upon reliably programming the electronic fuse 130.

The present disclosure is directed to various devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides electronic metal fuses in a semiconductor device wherein the programming efficiency may be enhanced, while at the same time an overall compact configuration may be achieved. To this end, the electronic metal fuse may be provided on the basis of a configuration in which superior thermal conditions may be achieved during the programming of the fuse, thereby enhancing the electromigration effect for a given current, thereby enabling the application of reduced programming currents, which in turn may result in a reduced size of corresponding transistor elements in the device level of the semiconductor device. To this end, the metal line of the electronic fuse may be provided in a compact two-dimensional configuration in which a central line portion may be laterally "confined," at least in some lateral directions, by other line portions, which may thus result in an increased heat at the center of the metal line of the electronic fuse. For example, in some illustrative embodiments disclosed herein, a helix-like two-dimensional configuration may be provided, thereby providing superior thermal conditions. Consequently, for substantially the same line length as in conventional metal fuses, a reduced programming current may be sufficient so as to reliably initiate electromigration in the electronic fuse. Moreover, the compact two-dimensional configuration with a lateral "confinement" of a central line portion may also provide superior conditions with respect to metal extrusion from the metal line, since peripheral line portions of the metal fuse may act as efficient "extrusion" lines, thereby avoiding non-predictable copper migration into the surrounding dielectric material.

One illustrative semiconductor device disclosed herein comprises a metallization system comprising a first metallization layer and a second metallization layer that is formed above the first metallization layer. The semiconductor device further comprises a first metal line formed in the first metallization layer and a second non-linear metal line formed in the second metallization layer. The semiconductor device further comprises a cathode via formed in the second metallization layer and connecting the second metal line with the first metal line, wherein the cathode via is positioned so as to be laterally offset from the second metal line along two orthogonal lateral directions by substantially the same amount. The cathode via and the second metal line form a fuse body of an electronic fuse.

A further illustrative semiconductor device disclosed herein comprises a metallization system and an electronic fuse formed in the metallization system. The electronic fuse comprises a fuse body, which in turn comprises a continuous non-linear metal line having a central line portion that is positioned laterally between a plurality of peripheral line portions of the continuous non-linear metal line.

A still further illustrative semiconductor device disclosed herein comprises a helix-like metal line formed in a metallization layer of a metallization system. The semiconductor device further comprises a via formed in the metallization layer and connecting a central line portion of the helix-like metal line to a metal region that is formed in a lower-lying metallization layer of the metallization system.

BRIEF DESCRIPTION OF THE DRAWINGS

The disclosure may be understood by reference to the following description taken in conjunction with the accompanying drawings, in which like reference numerals identify like elements, and in which.

Figure 1A:
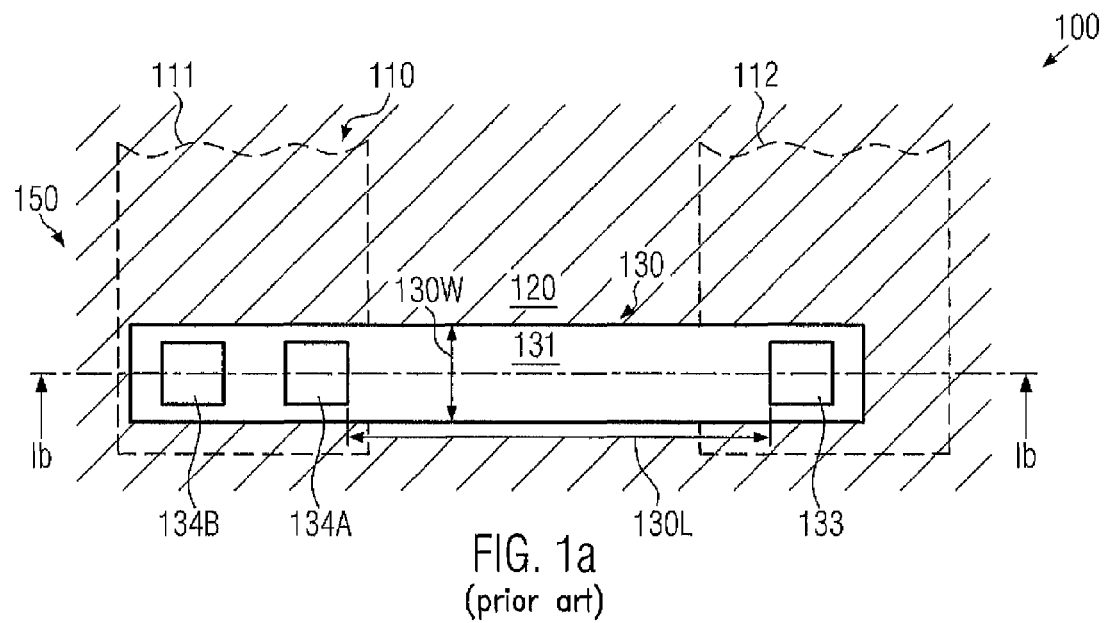
FIGS. 1a-1b schematically illustrate a top view and a cross-sectional view, respectively, of a semiconductor device including an electronic fuse formed in a metallization system on the basis of a conventional concept.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices including metal-based electronic fuses in which superior reliability in generating a programmed state and preserving the state with a high degree of detectability over the lifetime of the semiconductor device may be accomplished. To this end, the electromigration effect in the fuse body may be increased by providing superior thermal conditions. To this end, a two-dimensional configuration of the electronic fuse, i.e., of a metal line thereof, may be provided so as to induce a higher temperature, at least in some line portions of the metal line, for a given overall configuration of the metal line in accordance with design requirements of a corresponding metallization layer. To this end, a line portion may be laterally positioned between two or more other line portions, thereby forming a continuous non-linear metal line of the electronic fuse so that an increased temperature may be achieved in a central area of the non-linear metal line and the corresponding dielectric material, which may thus facilitate a desired metal degradation within the electronic fuse. For example, a helix-like configuration may be provided so that a central portion may experience an increased temperature due to an efficient heat generation of any peripheral line portions. The peripheral line portions may also represent efficient barriers for delineating a corresponding volume within the dielectric material of the metallization layer under consideration so as to suppress any non-controlled metal extrusion, as may typically occur in conventional designs, without requiring any additional extrusion lines. In this case, a portion of the continuous non-linear metal line of the electronic fuse may itself act as an extrusion line, while at the same time also acting as the fuse body of the electronic fuse. The central line portion of the non-linear metal line may be efficiently coupled to a current supply line in an adjacent metallization layer which may be provided below or above the metallization layer under consideration, wherein the corresponding via may also represent a zone of increased metal migration, thereby providing a high degree of compatibility of conventional "three-dimensional" electronic fuses including vias and metal lines. Moreover, due to the two-dimensional non-linear configuration, a very compact structure, at least in one lateral dimension, may be obtained, wherein the total length of the non-linear metal line may be comparable or even less compared to conventional designs, while at the same time the programming current may be reduced.

The superior two-dimensional configuration, such as the helix-like configuration, may be combined with any other additional electromigration-causing mechanisms, such as providing specific interfaces which may have been recognized as major diffusion paths for the current-induced metal migration and the like, thereby even further enhancing the overall efficiency and reliability of the electronic fuse, while at the same time reducing the required programming currents.

Figure 1B:
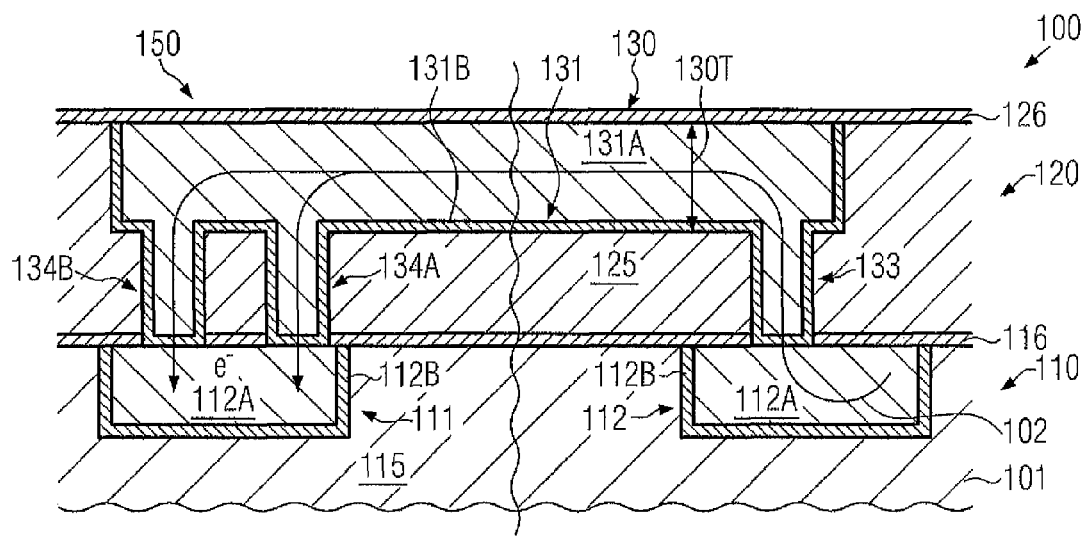
Figure 2A:
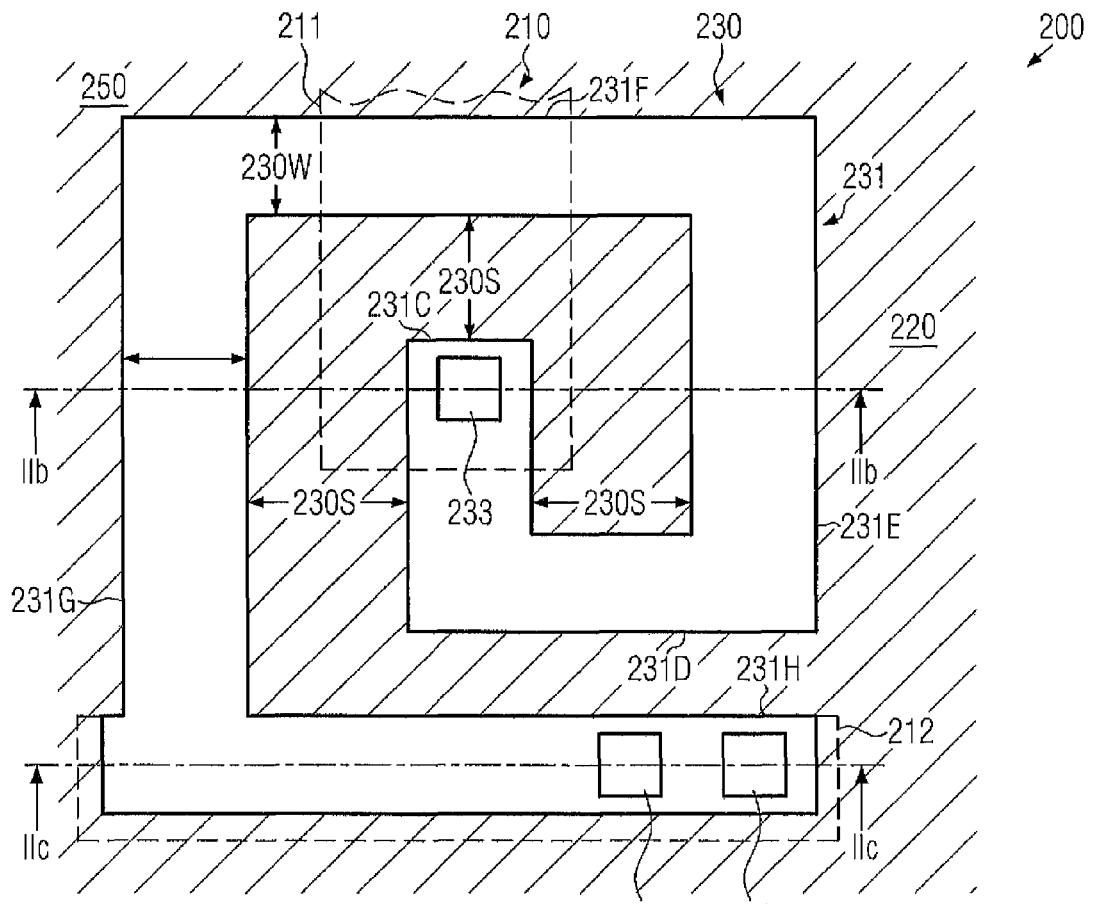
FIG. 2a schematically illustrates a top view of a semiconductor device comprising an electronic fuse provided in the metallization system, wherein a superior two-dimensional configuration based on a non-linear metal line of the electronic fuse may provide superior thermal conditions, according to illustrative embodiments.
Figure 2B:
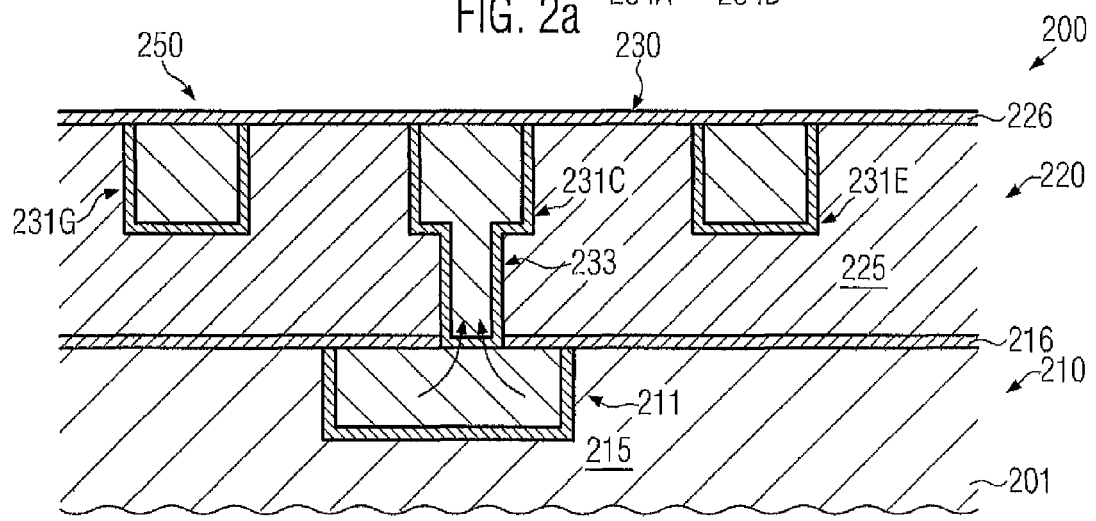
FIGS. 2b-2c schematically illustrate cross-sectional views of a metal fuse of FIG. 2a, according to still further illustrative embodiments.
Figure 2C:
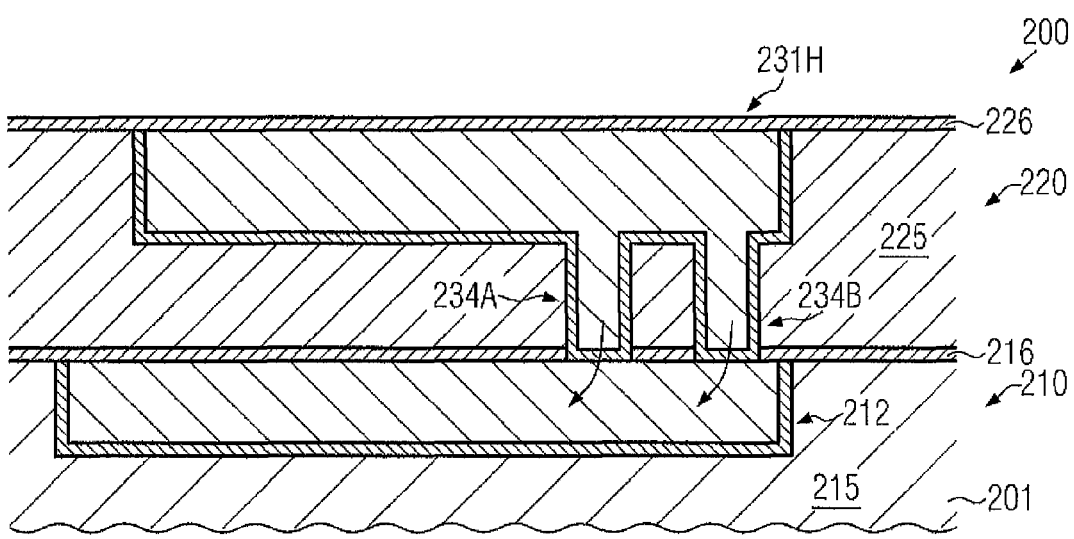

With reference to FIGS. 2a-2c, further illustrative embodiments will now be described in more detail, wherein reference may also be made to FIGS. 1a-1b, if required.

FIG. 2a schematically illustrates a top view of a semiconductor device 200 comprising a metallization system 250, which in turn may include a plurality of stacked metallization layers, as is, for instance, also described above with reference to the semiconductor device 100. For convenience, two adjacent metallization layers 210 and 220 are schematically illustrated in FIG. 2a, wherein it should be appreciated that the layers 210, 220 may represent any adjacent metallization layers at any vertical position within the metallization system 250. For example, the layer 210 may represent the very first metallization layer, while, in other cases, one or more metallization layers may be provided below the metallization layer 210. As indicated, the metallization layer 210 may comprise a plurality of metal features as required for interconnecting semiconductor elements and the like, wherein, for convenience, any such metal features are not illustrated in FIG. 2a. Furthermore, the metallization layer 210 may include a first metal line 212 and a second metal line 211, which may act as supply lines for establishing a current flow for an electronic fuse 230, which may be formed in the metallization layer 220. In the configuration illustrated in FIG. 2a, the metallization layer 210 may be positioned "below" the metallization layer 220, while, in other cases, the metallization layer 210 may be provided above the metallization layer 220, depending on the overall process and device requirements. The metal lines 211, 212 may have any geometric configuration so as to substantially avoid significant electromigration effects and provide the current drive capability for supplying an appropriate programming current to the fuse 230 during a programming activity.

The metal fuse 230 may be provided in the metallization layer 220, which may also include other metal features as required for interconnecting circuit elements of the semiconductor device 200. For convenience, any such metal features are not shown in FIG. 2a. The electronic fuse 230 may have an appropriate two-dimensional configuration with respect to a metal line 231 such that a superior electromigration effect may be achieved for a given effective length of the metal line 231 compared to substantially linear configurations, as is, for instance, previously described with reference to the semiconductor device 100. To this end, the continuous non-linear metal line 231 may have an appropriate geometric design such that a central line portion 231C may be efficiently thermally coupled to at least two or more other line portions so as to provide an increased temperature at and in the vicinity of the central line portion 231C. In the embodiment shown, the central line portion 231C may be positioned laterally between at least two further line portions, such as line portions 231E and 231G, which may, when operated so as to conduct a sufficient high current, generate corresponding heat, which may thus also be efficiently transferred towards the central line portion 231C, thereby increasing the local temperature at and in the vicinity of the line portion 231C. Moreover, further line portions, such as line portions 231D, 231F, may also provide an efficient thermal "confinement" of the central line portion 231C, which may thus represent a "hot spot" of the electronic fuse 230. In some illustrative embodiments, the continuous metal line 231 may comprise a plurality of linear line portions, such as the portions 231C, 231D, 231E, 231F, 231G and 231H, wherein at least some of which may be formed on the basis of critical dimensions corresponding to the metallization layer 220. That is, at least some of these line portions, and in one illustrative embodiment each of the plurality of line portions except for the line portion 231H, may represent a fuse body of the electronic fuse 230 and may have a width 230W, which may correspond to a minimum width that is compatible with the design rules of the metallization layer 220. Furthermore, in some illustrative embodiments, the space between certain line portions of the non-linear metal line 231 may also be selected as the minimum critical spacing, for instance indicated as 230S, thereby providing an efficient thermal coupling of the central line portion 231C to other line portions, such as peripheral line portions 231E, 231F, 231G. Consequently, in the embodiment shown in FIG. 2a, the central line portion 231C may be laterally positioned between the line portions 231E and 231G, which may have substantially the same offset 230S from the portion 231C, which may be understood that the same distance may be provided except for any process-related variations. Similarly, the line portion 231F may be separated by the offset 230S so that in this case the helix-like configuration may be obtained on the basis of linear line portions having critical line width and spaces, as indicated by 230W and 230S. Moreover, the central line portion 231C may be connected to the lower-lying metallization layer 210 by a via 233, which may represent a "cathode" via since the electron flow direction may be from the metal line 212 into the metal line 231 and through vias 234A, 234B into the metal line 211. Consequently, in this current flow path, the via 233, the central portion 231C and the line portions 231D, 231E, 231F, 231G may represent the actual fuse body in which a significant copper migration may be induced, while the line portion 231H in combination with the vias 234A, 234B may have an appropriate configuration so as to avoid any significant electromigration effect therein. The dimensions of the line portion 231H may also be selected so as to act as a stress buffer region, which may thus accommodate a significant amount of the compressive stress which may typically be created in the remaining line portion 231 upon increasingly inducing metal migration from the central portion of the fuse 230 towards the line portion 231H. That is, as previously discussed, upon inducing a current and heat induced diffusion of metal atoms within the metal line 231, a material depletion may occur starting from the via 233 and the central line portion 231C, which may increasingly result in a material densification, for instance by "filling" any grain boundaries and thus forming increased metal grains, which in turn may result in significant compressive stress which may thus be efficiently transferred into the line portion 231H, thereby providing superior electromigration conditions since a reduced compressive stress may facilitate further metal diffusion in the line 231.

It should be appreciated that, generally, any other "helix"-like configuration may be used, for instance by selecting other angles for connecting the line portions 231C, 231D, 231E, 231F, 231G, 231H, rather than using approximately 90 degree angles, if considered appropriate in view of inducing a desired high degree of current crowding within the individual transition areas between the linear line portions of the metal line 231. It should be appreciated that, depending on the lithography and patterning capabilities of the corresponding process technology, certain deviations may also be generated upon actually implementing the helix-like design of the electronic fuse 230. For example, any corners between the linear line portions of the continuous metal line 231 may be rounded to a certain degree when using 90 degree angles for connecting two adjacent non-collinear line portions, as illustrated in FIG. 2a. In this case, using other angles for connecting non-collinear line portions may be applied, which may result in a somewhat less reduced confinement for the benefit of less critical patterning conditions. In this case, a "polygonal" configuration may be obtained to a certain degree instead of the substantially "square-like" helix as shown in FIG. 2a.

FIG. 2b schematically illustrates a cross-sectional view according to the line IIb in FIG. 2a. As illustrated, the semiconductor device 200 may comprise a substrate 201, which may include any appropriate material or material layers for providing circuit elements, such as transistors, resistors and the like, in combination with a contact structure so as to appropriately connect the circuit elements with the metallization system 250, as is also previously discussed with reference to the semiconductor device 100. As illustrated, the metallization layer 210 may comprise a dielectric material 215, in which is embedded the metal line 211, followed by a dielectric cap layer or etch stop layer 216. With respect to any characteristics of these components, the same criteria may apply as previously explained with reference to the device 100, when referring to the components 115, 111 and 116. Similarly, the metallization layer 220 may comprise a dielectric material 225 in which is embedded the electronic fuse 230, wherein the central line portion 231C, in combination with the "peripheral" line portions 231E and 231G, is illustrated in the section of FIG. 2b. Moreover, the via 233 connects the metal line 211 with the central line portion 231C. As indicated above, the line portions 231C, 231E, 231G may be provided with critical dimensions in view of line width and spacing, thereby providing a very compact overall configuration while also providing superior thermal coupling of the line portions 231G, 231E and the central portion 231C. Consequently, the via 233 in combination with the central line portion 231C may act as a hot spot of the electronic fuse 230, thereby obtaining superior electromigration, at least in the via 233 and the central portion 231C. Moreover, the metallization layer 220 may comprise an etch stop or dielectric cap layer 226, wherein, also in view of any material characteristics and configuration of any metal regions, the same criteria may apply as previously discussed with reference to the semiconductor device 100.

FIG. 2c schematically illustrates a cross-sectional view along the section IIc of FIG. 2a, wherein the line section 231H in the metallization layer 220 may be coupled to the metal line 212 in the metallization layer 210 by means of the vias 234A, 234B.

The semiconductor device as shown in FIGS. 2a-2c may be formed on the basis of any appropriate process strategy, for instance based on similar techniques as previously described with reference to the semiconductor device 100. It should be appreciated, however, that an appropriate lithography mask may be provided so as to obtain the desired superior two-dimensional configuration of the continuous non-linear metal line 231 (FIG. 2a) in combination with any appropriate patterning regime.

Upon operating the semiconductor device 200 and initiating a programming activity for the electronic fuse, a current flow may be established on the basis of operating any appropriate transistor elements in the device 200 so as to finally induce a current, wherein the via 233 (FIG. 2b) may act as a cathode of the electronic fuse 230 which receives an appropriate electron flow from the metal line 211. On the other hand, the line portion 231H in combination with the vias 234A, 234B (FIG. 2c) may act as an anode wherein significant electromigration may be suppressed in the anode of the electronic fuse 230 due to appropriately selected overall dimensions, which may result in a non-critical current density therein. Consequently, when establishing the electron flow from the via 233 (FIG. 2a), heat may be increasingly generated within the metal line 231 and heat and current induced metal diffusion may be initiated within the via 233 and along the line portions 231C, 231D, 231E, 231F, 231G. As indicated above, by the superior thermal conditions in the central portion of the electronic fuse 230, i.e., around the central line portion 231C and around the via 233, superior metal diffusion may be initiated for a given programming current, while additionally the line portions 231E, 231F, 231G may act as efficient "extrusion lines," which may efficiently suppress or prevent copper extrusion into the dielectric material of the layer 220 outside the helix of the electronic fuse 230. In the case of copper extrusion, a corresponding material migration may be substantially restricted to the interior of the helix of the fuse 230. Consequently, a reliable degradation of the metal line 231 may be accomplished with a reduced current compared to conventional strategies, even if the total length of the line 231 may correspond to the length 130L of the fuse 130, as illustrated in FIG. 1a. Therefore, transistors of reduced width may be provided for the electronic fuse 230, which may result in an increased packing density, wherein any additional extrusion lines may be omitted.

As a result, the present disclosure provides semiconductor devices in which metal fuses of superior programming efficiency may be provided in the metallization system by using a substantially helix-like configuration of the metal line of the electronic fuse. Consequently, superior temperature conditions may be achieved in the center of the helix upon programming the electronic fuse, which in turn may result in reduced programming currents for a given total length of the metal line. Moreover, due to the lateral confinement of the central line portion, a non-controlled copper extrusion into the dielectric material of the metallization layer may be reduced. Consequently, electronic fuses may be provided in combination with any desired complex circuit elements, such as sophisticated high-k metal gate electrode structures, which may be formed on the basis of a replacement gate approach, i.e., on the basis of a process strategy in which polysilicon material may be removed from electrode structures in the device level in a very advanced manufacturing stage.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a metallization system comprising a first metallization layer and a second metallization layer positioned above said first metallization layer;
a first metal line positioned in said first metallization layer;
a second non-linear metal line positioned in said second metallization layer; and
a cathode via positioned in said second metallization layer and connecting said second non-linear metal line with said first metal line, said cathode via being positioned so as to be laterally offset from said second non-linear metal line along two orthogonal lateral directions by substantially the same amount, said cathode via and said second non-linear metal line forming a fuse body of an electronic fuse.

2. The semiconductor device of claim 1, further comprising a third metal line positioned in said first metallization layer and one or more anode vias positioned in said second metallization layer and connecting said third metal line with said second non-linear metal line.

3. The semiconductor device of claim 1, wherein said second non-linear metal line comprises a plurality of linear line portions.

4. The semiconductor device of claim 3, wherein a central one of said plurality of linear line portions connects to said cathode via and is laterally positioned between first and second line portions of said plurality of linear line portions.

5. The semiconductor device of claim 4, wherein said first and second linear line portions are offset from said central line portion by substantially the same amount.

6. The semiconductor device of claim 1, wherein a width of at least a portion of said second non-linear metal line having said lateral offset from said cathode via is substantially constant.

7. The semiconductor device of claim 1, wherein a minimum width of said second non-linear metal line is approximately 100 nm or less.

8. The semiconductor device of claim 1, wherein said second metallization layer comprises a low-k dielectric material.

9. A semiconductor device, comprising:
a metallization system;
an electronic fuse positioned in a first metallization layer of said metallization system, said electronic fuse comprising a fuse body, said fuse body comprising a continuous non-linear metal line having a central line portion positioned laterally between a plurality of peripheral line portions, wherein said central line portion and said plurality of peripheral line portions form a helix-like configuration;
a first metal line positioned in a second metallization layer of said metallization system, wherein said second metallization layer is positioned below said first metallization layer and said first metal line is conductively coupled to said electronic fuse; and
a second metal line positioned in said second metallization layer, wherein said second metal line is conductively coupled to said electronic fuse.

10. The semiconductor device of claim 9, wherein at least some of said plurality of peripheral line portions are linear line portions.

11. The semiconductor device of claim 10, wherein each of said plurality of peripheral line portions and said central line portion are linear line portions.

12. The semiconductor device of claim 9, wherein each of said plurality of line portions has substantially the same offset from said central line portion.

13. The semiconductor device of claim 9, wherein said electronic fuse further comprises a central via connecting to said central line portion, said central via conductively coupling said central line portion to said second metal line.

14. The semiconductor device of claim 13, further comprising one or more peripheral vias connecting to one of said peripheral line portions, said one or more peripheral vias conductively coupling said one of said peripheral line portions to said first metal line.

15. A semiconductor device, comprising:
an electronic fuse comprising a helix-like metal line positioned in a metallization layer of a metallization system, said helix-like metal line comprising a plurality of linear line portions; and
a first via positioned in said metallization layer and connecting a central line portion of said helix-like metal line to a first metal region positioned in a lower lying metallization layer of said metallization system, wherein at least two of said plurality of linear line portions are non-collinear and have substantially the same offset from said central line portion.

16. The semiconductor device of claim 15, further comprising a second via positioned in said metallization layer and connecting a peripheral line portion of said helix-like metal line to a second metal region positioned in said lower lying metallization layer.

* * * * *